(12) United States Patent
Kirchner

(10) Patent No.: US 6,692,338 B1
(45) Date of Patent: Feb. 17, 2004

(54) THROUGH-PAD DRAINAGE OF SLURRY DURING CHEMICAL MECHANICAL POLISHING

(75) Inventor: Eric J. Kirchner, Weston, MA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 08/899,464

(22) Filed: Jul. 23, 1997

(51) Int. Cl.[7] .................................................. B24B 7/22
(52) U.S. Cl. ............................. 451/41; 451/446; 451/60
(58) Field of Search .......................... 451/446, 60, 287, 451/288, 41, 527, 530

(56) References Cited

U.S. PATENT DOCUMENTS

| | | | |
|---|---|---|---|
| 4,490,948 A | * | 1/1985 | Hanstein et al. ............. 451/490 |
| 5,081,051 A | | 1/1992 | Mattingly et al. |
| 5,216,843 A | | 6/1993 | Breivogel et al. |
| 5,232,875 A | * | 8/1993 | Tuttle et al. ................ 437/225 |
| 5,441,598 A | * | 8/1995 | Yu et al. .................... 156/645.1 |
| 5,489,233 A | | 2/1996 | Cook et al. .................... 451/41 |
| 5,533,923 A | * | 7/1996 | Shamouilian et al. ......... 451/41 |
| 5,536,202 A | | 7/1996 | Appel et al. |
| 5,547,417 A | | 8/1996 | Breivogel et al. |
| 5,554,064 A | * | 9/1996 | Breivogel et al. ............. 451/41 |
| 5,609,719 A | * | 3/1997 | Hempel ....................... 451/527 |
| 5,658,185 A | * | 8/1997 | Morgan, III et al. .......... 451/36 |
| 5,725,420 A | * | 3/1998 | Torii ........................... 451/288 |

FOREIGN PATENT DOCUMENTS

| | | | | |
|---|---|---|---|---|
| JP | 1321161 | * | 12/1989 | ................. 451/446 |
| JP | 2100321 | * | 4/1990 | ................. 451/446 |

OTHER PUBLICATIONS

Rodel IC 1000–A1 CMP Pad Feb. 1998.
Rodel IC 1400–A4 CMP Pad Feb. 1998.

* cited by examiner

Primary Examiner—Robert A. Rose
(74) Attorney, Agent, or Firm—Ralph Veseli

(57) ABSTRACT

Provided is a chemical mechanical polishing pad which as capable of draining used slurry from the polishing pad surface through the pad. Chemical mechanical polishing pads according to preferred embodiments of the present invention have slurry drain holes to drain slurry from the pad surface. In various preferred embodiments, the drain holes are combined with drain grooves in the pad surface and/or the pad/pad backing or pad/platen interface to provide a path for used slurry to exit the pad. The invention also provides a method of conducting CMP using through-pad slurry drainage.

28 Claims, 6 Drawing Sheets

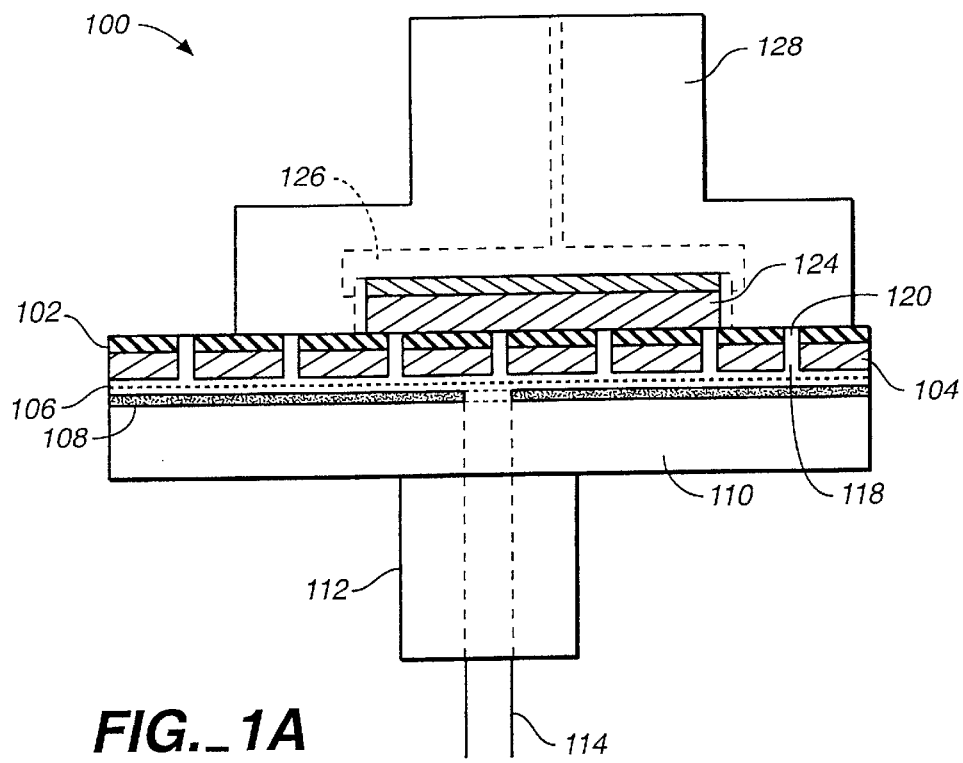
FIG._1A
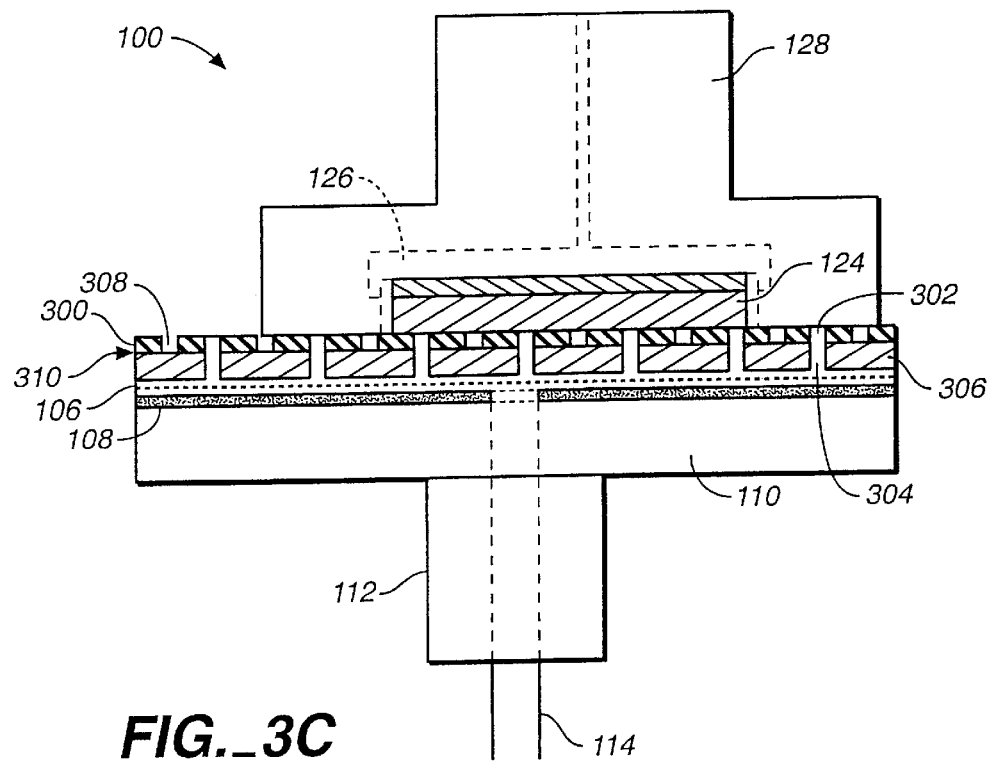
FIG._3C

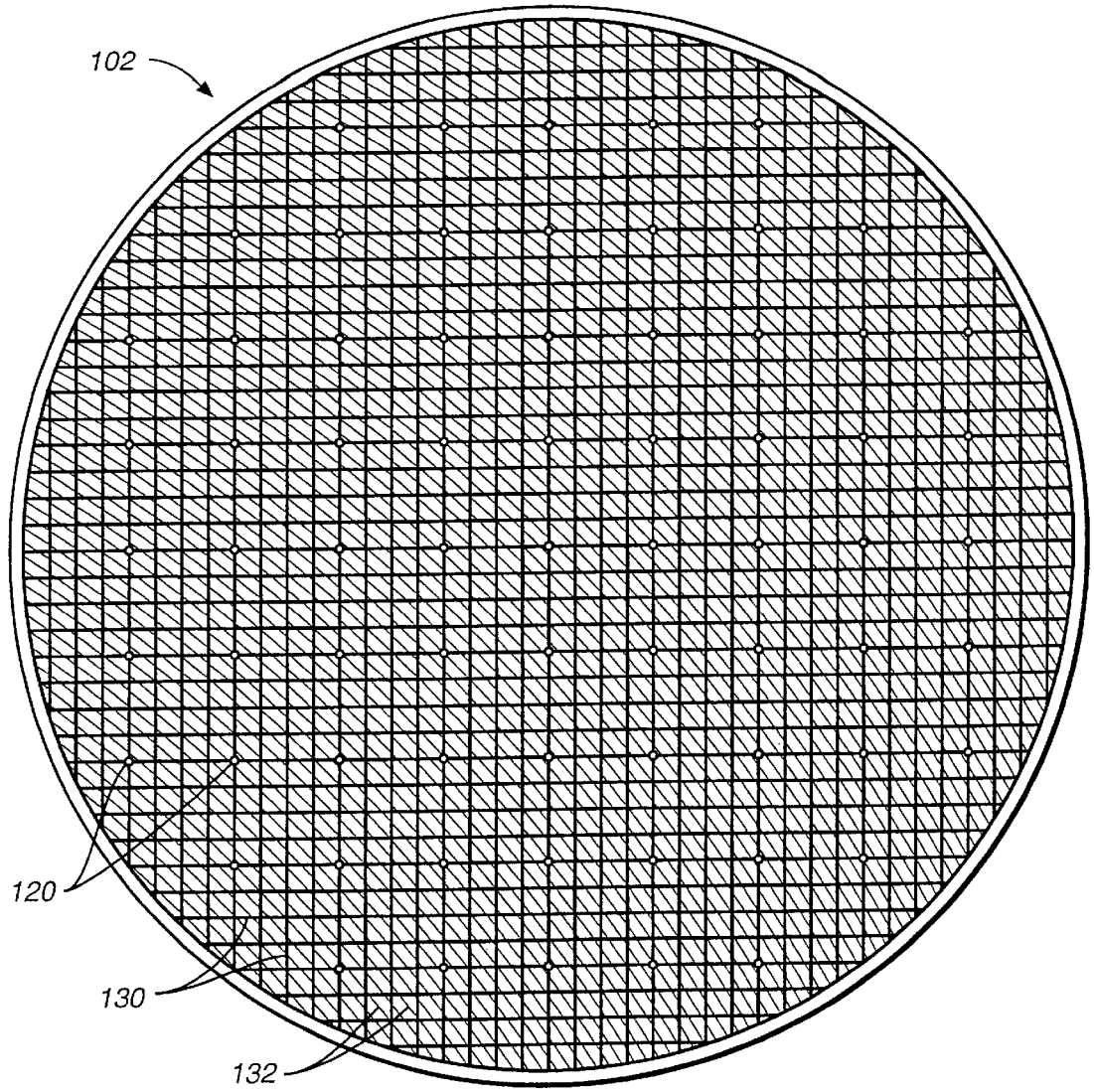
FIG._1B

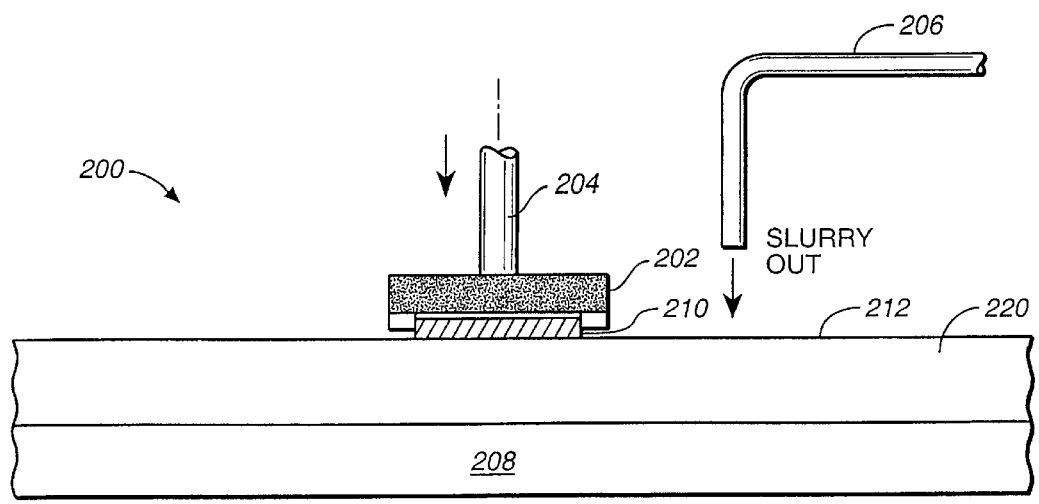
FIG._2A
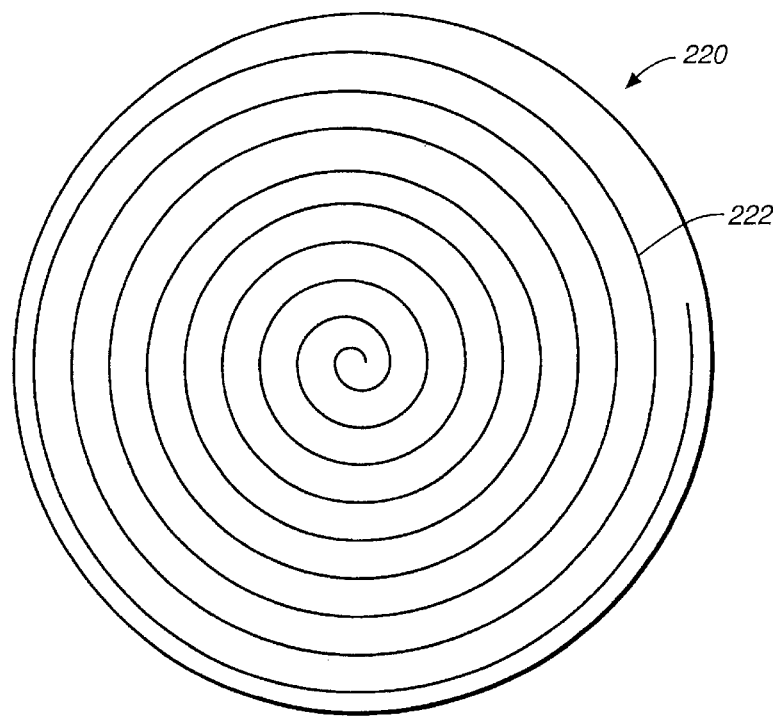
FIG._2B

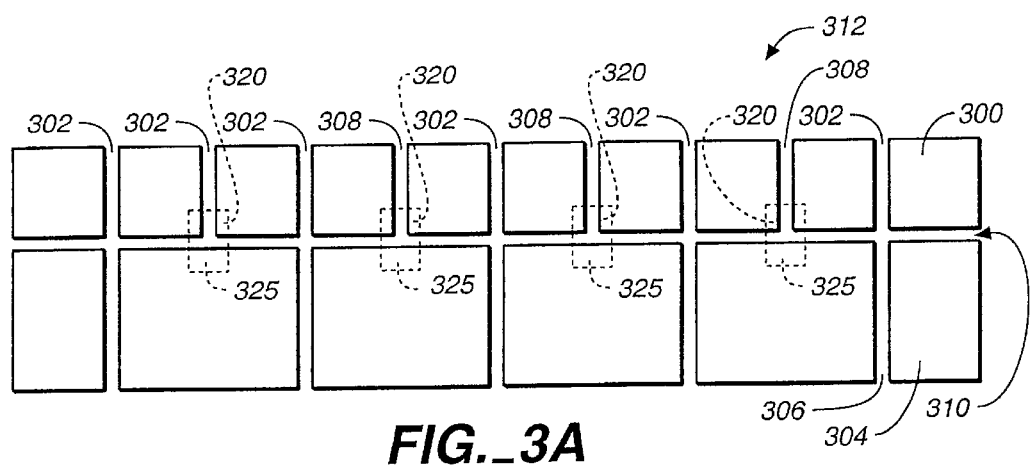
FIG._3A
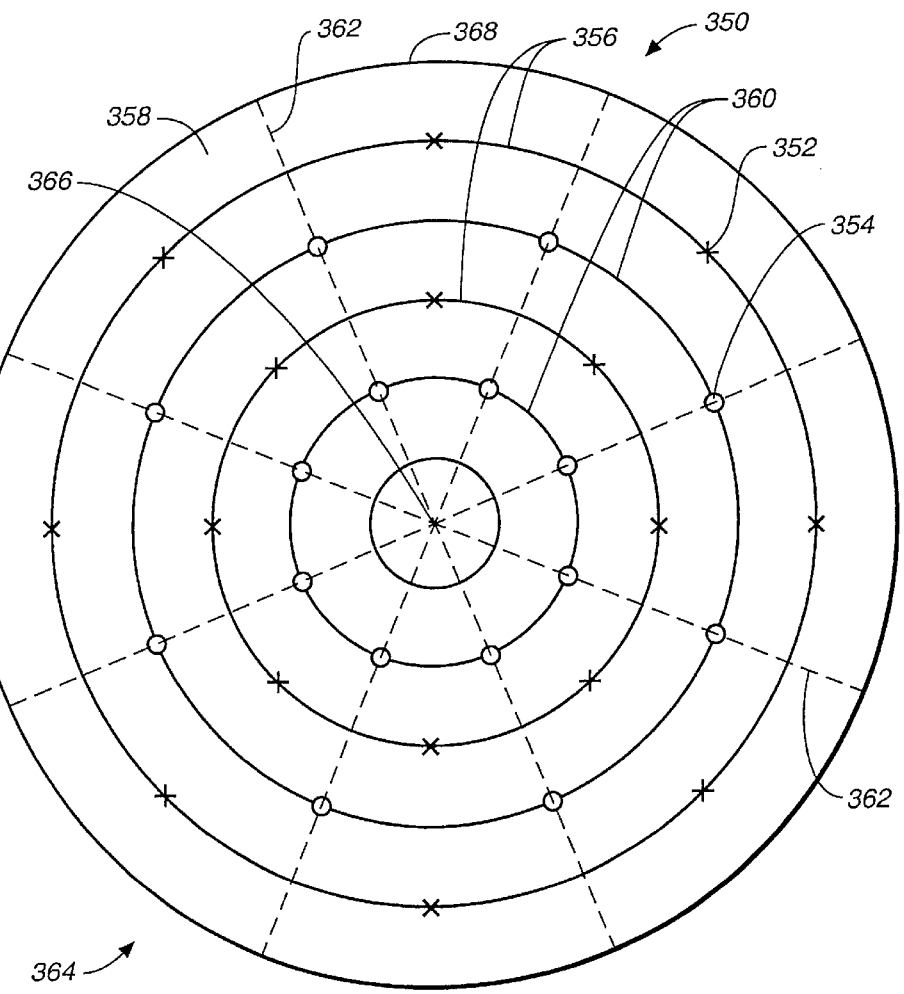
FIG._3B

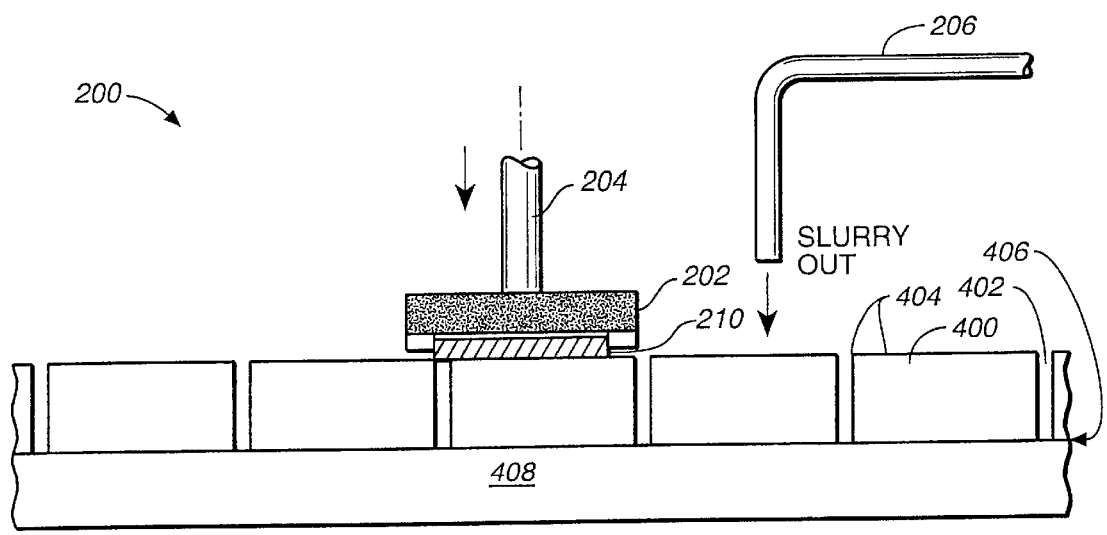
FIG._4A
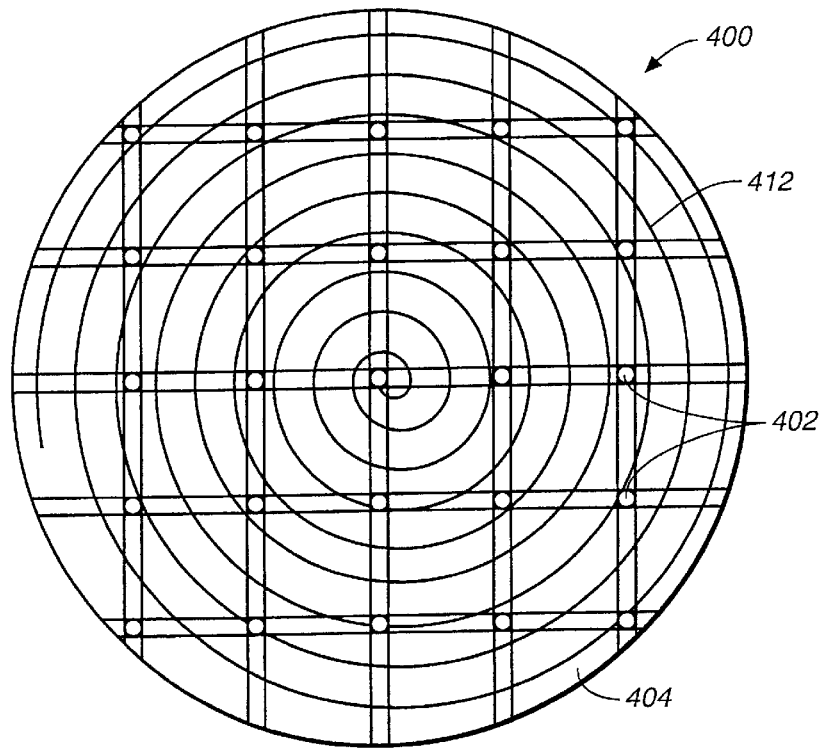
FIG._4B

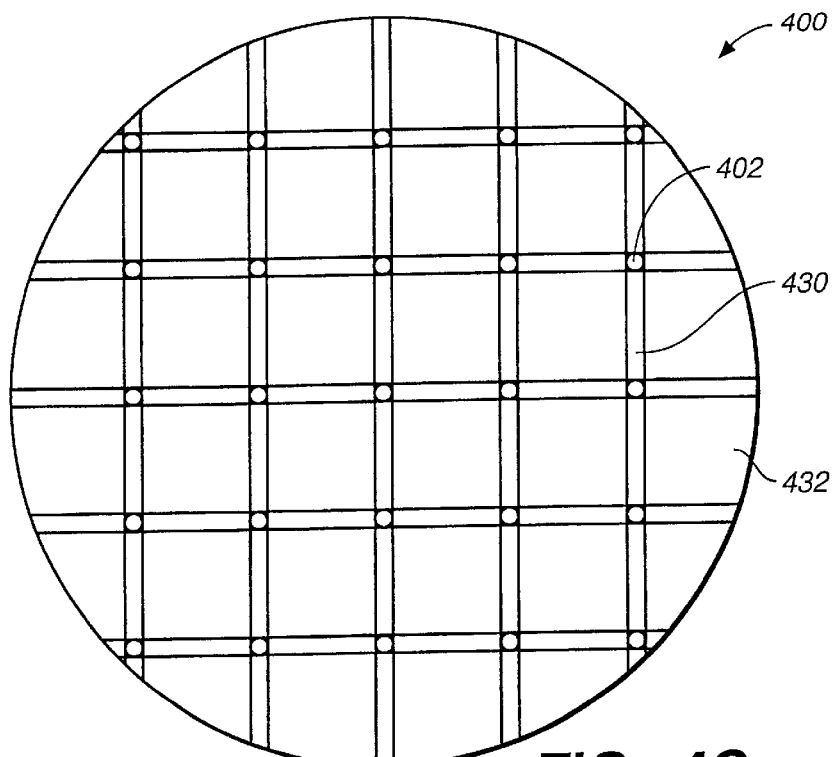
FIG._4C
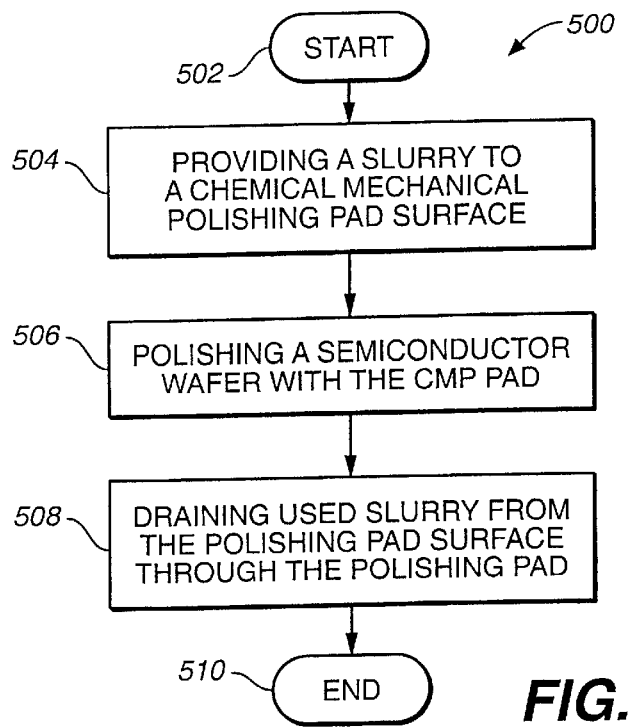
FIG._5

THROUGH-PAD DRAINAGE OF SLURRY DURING CHEMICAL MECHANICAL POLISHING

BACKGROUND OF THE INVENTION

The present invention relates to drainage of slurry from a polishing pad employed in chemical mechanical polishing. More particularly, the present invention relates to through-pad drainage of slurry from a chemical mechanical polishing pad.

Chemical mechanical polishing (sometimes referred to as "CMP") typically involves mounting a semiconductor wafer faced down on a holder and rotating the wafer face against a polishing pad mounted on a platen, which in turn is rotating or moving linearly or orbitally. A slurry containing a chemical that chemically interacts with the facing wafer layer and an abrasive that physically removes that layer is flowed between the wafer and the polishing pad or on the pad near the wafer. In integrated circuit (IC) wafer fabrication, this technique is commonly applied to planarize various wafer layers such as dielectric layers, metallization layers, etc.

Slurry flow during chemical mechanical polishing of IC device silicon wafers can play an important role in uniformity of removal of material from the wafer surface. With exposure time to the wafer surface, the slurry's chemistry becomes neutralized and its abrasive particles are altered—being either agglomerated or broken apart. The slurry also becomes loaded with by-products, which are either in solution or suspended particles. All of these factors reduce the effectiveness of the slurry with exposure time.

On a rotary or a linear polisher, wafers move over the moving pad surface. Slurry is provided directly to the polishing pad surface from a source disposed above the pad. Therefore, the slurry is exposed to the edge of a wafer first, and the center of the wafer always sees "old" slurry. On an orbital polisher with through-the-pad slurry injection, the slurry flow is generally out toward the edges of the wafer, as governed by centripetal forces and slurry pressure distribution. Depending on injection hole distribution, the dwell time (the length of time the slurry spends on the pad's polishing surface) will vary. The edge of the wafer will see fresh slurry from nearby injection points plus "older" slurry injected near the wafer center. It should be noted that all by-products must flow past the wafer edge to exit the wafer-pad interface.

The quality and effectiveness of chemical mechanical planarization is a function of several factors including slurry application rate, distribution of slurry flow across the polishing pad, the dwell time of slurry on the polishing surface, and the slurry drain rate from the polishing surface. In conventional CMP, some of these parameters may be controlled with some degree of certainty. However, others such as the slurry flow across the pad and the slurry drain rate from the pad are not subject to any fine level of control.

FIG. 1A shows some major components of a chemical mechanical polishing (CMP) apparatus such as an Avantgaard 676, commercially available from Integrated Processing Equipment Corporation (IPEC) of Phoenix, Arizona. CMP apparatus 100 includes a wafer carrier 128 that is fitted with an air chamber 126 (shown in phantom lines), which is designed to secure a wafer 124 by vacuum to wafer carrier 128 during wafer loading typically before CMP is to commence. During CMP, however, wafer 124 is bound by "wear rings" (not shown to simplify illustration) within wafer carrier 128 such that a wafer surface that is to be polished contacts a polishing pad 102. During CMP, the polishing pad 102 orbits while the wafer 124 rotates.

A conventional polishing pad 102 for use with an apparatus such as illustrated in FIG. 1A includes a plurality of slurry injection holes 120, and adheres to a flexible pad backing 104 which includes a plurality of pad backing holes 118 aligned with the slurry injection holes 120. A slurry mesh 106, typically in the form of a screen-like structure, is positioned below the pad backing 104. An air bladder 108 capable of inflating or deflating is disposed between a plumbing reservoir 110 and the slurry mesh 106. The air bladder 108 pressurizes to apply the polishing force. A co-axial shaft 112, through which a slurry inlet 114 (shown by phantom lines) is provided to deliver slurry through the plumbing reservoir 110 and the air bladder 108 to the slurry mesh 106, is attached to the bottom of plumbing reservoir 110. Slurry is delivered to the system by an external low pressure pump. In this configuration, a slurry flow path is defined by the slurry entering through slurry inlet 114, spreading out through the slurry mesh 106 below the pad backing 104, entering pad backing holes 118 and exiting through slurry injection holes 120 on the surface of polishing pad 102. Slurry is distributed on the pad surface by centripetal force, the polishing action, and slurry pressure distribution on the pad 102.

A CMP pad used in a slurry injection system is typically provided with grooves in its polishing surface for slurry distribution and improved pad-wafer contact. These grooves are of two types, either or both of which may be present on a conventional pad's polishing surface. The smaller of the two groove types, sometimes referred to as "microgrooves," are typically about 10 mils wide and 10 mils deep. Microgrooves increase the pad roughness and thereby facilitate the polishing process by creating point contacts and providing space for a small amount of slurry at the wafer-pad surface interface during CMP. Larger or "macrogrooves" (also referred to as slurry distribution grooves) increase the amount of slurry that may be applied to the polishing pad surface per unit area, and thereby increase CMP efficiency. Conventional macrogrooves are typically about 50 mils deep by 50 mils wide.

FIG. 1B shows a top view of a conventional polishing pad 102, such as used with the slurry injection CMP apparatus shown in FIG. 1. An example of such a pad is the IC 1000, commercially available from Rodel Inc., Newark, Delaware. Polishing pads may be made of materials including, for example, urethane, polyurethane, felt, polymer and a filler material. Polishing pad 102 includes macrogrooves (slurry distribution grooves) 130, which are shown in an X-Y configuration, and microgrooves 132 which oriented diagonally relative to macrogrooves 130. At various intersections of grooves 130 in the X direction and grooves 130 in the Y direction, slurry injection holes 120 are provided.

FIG. 2A shows some major components of an alternative chemical mechanical polishing apparatus 200 in which slurry is not injected through the pad to the polishing surface, but is instead applied directly to the polishing surface 212 by a conduit 206 positioned above the pad 220. An example of such an apparatus is the Avantgaard 472, commercially available from Integrated Processing Equipment Corporation (IPEC) of Phoenix, Arizona. CMP apparatus 200 includes a wafer carrier 202, which is designed to secure a wafer 210 during CMP. The carrier 202 is connected to a shaft 204 which moves the carrier 202 towards or away from the polishing pad 220 and rotates and translates the carrier 202 and wafer 220 during polishing.

As shown in FIG. 2B, a conventional polishing pad 220 used in this type of CMP system is not typically provided with grooves in its polishing surface for slurry distribution. These pads 220 may have small "microgrooves" 222, about 10 mils deep and 10 mils wide, to increase the pad roughness and thereby facilitate the polishing process by creating point contacts and providing space for a small amount of slurry at the wafer-pad surface interface during CMP. These pads 220 also do not have a pad backing, but instead are placed on a table or platen 208. During polishing, the platen 208 rotates or orbits with the pad while the wafer 220 in the carrier 202 rotates and translates.

In both of the conventional CMP systems described above, slurry flow across the polishing surface of the pad is largely governed by centripetal force resulting from the rotation of the pad. Used slurry eventually flows off the edge of the pad and is lost. Additionally, control of slurry flow is minimal. Uneven slurry flow can result in uneven polishing and differential material removal rates across the wafer.

Thus, what is needed is a CMP polishing pad which permits greater control over slurry flow across and off the polishing surface and off the pad.

SUMMARY OF THE INVENTION

To achieve the foregoing, the present invention provides a chemical mechanical polishing pad which is capable of draining used slurry from the polishing pad surface through the pad. CMP pads according to preferred embodiments of the present invention have slurry drain holes to drain slurry from the pad surface. In various preferred embodiments, the drain holes are combined with drain grooves in the pad surface and/or the pad/pad backing or pad/platen interface to provide a path for used slurry to exit the pad.

Preferred embodiments of the through-pad slurry drainage system of the present invention also improve slurry flow across the polishing surface. Slurry distribution grooves in the pad surface direct the slurry along their paths. These slurry distribution grooves help prevent accumulations of fresh slurry in regions of the pad surface, particularly those immediately adjacent to injection holes, which could result in local increased material removal and uneven polishing.

The present invention provides a CMP pad having a polishing surface and a bottom surface, and drain holes through the polishing surface to the bottom surface which are capable of providing an exit path for slurry to leave the polishing surface. The pad also includes slurry drain grooves in its bottom surface which are aligned with the drain holes. The drain grooves are capable of providing an exit path for slurry to leave the pad.

The invention also provides a CMP polishing pad having a polishing surface and a bottom surface and having substantially evenly distributed slurry injection holes and slurry drainage holes in the pad. These holes are aligned with concentric circular slurry injection grooves and slurry drain grooves in the pad's surface. The pad's bottom surface also contains radial slurry drain grooves which intersect the slurry drain holes.

Another aspect of the present invention is an apparatus for chemical mechanical polishing including a chemical mechanical polishing pad having a polishing surface, a bottom surface and slurry drain holes through the pad. The apparatus also includes a pad backing having a top surface in engagement with the bottom surface of the polishing pad. The top surface of the pad backing has one or more slurry drain grooves aligned with the slurry drain holes in the polishing pad.

A further aspect of the present invention is a platen for supporting a chemical mechanical polishing pad which includes a surface for engaging a CMP pad, and drain grooves in the surface for facilitating removal of slurry from the polishing pad during chemical mechanical polishing.

The invention additionally provides a process of planarization a semiconductor wafer. The process involves providing a slurry to a chemical mechanical polishing pad surface, polishing a semiconductor wafer with the CMP pad, and draining used slurry from the polishing pad surface through the pad.

These and other features and advantages of the present invention are described below with reference to the drawings.

BRIEF DESCRIPTION OF THE DRAWINGS

FIG. 1A depicts a cross-sectional view of a typical slurry injection chemical mechanical polishing apparatus.

FIG. 1B depicts a top view of a chemical mechanical polishing pad for use with the apparatus of FIG. 1A, with slurry distribution grooves arranged in a grid pattern on the pad's polishing surface.

FIG. 2A depicts a cross-sectional view of a typical chemical mechanical polishing apparatus which uses direct topical application of slurry to the polishing pad surface.

FIG. 2B depicts a top view of a chemical mechanical polishing pad for use with the apparatus of FIG. 2A.

FIG. 3A depicts a cross-sectional view of a chemical mechanical polishing pad in accordance with a preferred embodiment of the present invention.

FIG. 3B depicts a top view of a chemical mechanical polishing pad in accordance with a preferred embodiment of the present invention.

FIG. 3C depicts a cross-sectional view of a slurry injection chemical mechanical polishing apparatus with a chemical mechanical polishing pad of FIG. 3A.

FIG. 4A depicts a cross-sectional view of a chemical mechanical polishing pad in accordance with an alternative embodiment of the present invention with the chemical mechanical polishing apparatus illustrated in FIG. 2A.

FIG. 4B depicts a top view of the chemical mechanical polishing pad in accordance with an alternative embodiment of the present invention shown in FIG. 4A.

FIG. 4C depicts a bottom view of the chemical mechanical polishing pad of FIG. 4B.

FIG. 5 is a flow chart depicting the steps of a method of conducting chemical mechanical polishing in accordance with a preferred embodiment of the present invention.

DETAILED DESCRIPTION OF THE PREFERRED EMBODIMENTS

The present invention provides apparatuses and methods for through pad slurry drainage in CMP. In the following description, numerous specific details are set forth in order to fully illustrate preferred embodiments of the present invention. It will be apparent, however, that the present invention may be practiced without limitation to some specific details presented herein.

Unless otherwise noted, feature dimensions for the preferred. embodiments of the present invention described herein are provided for a standard ten inch diameter CMP pad. One of ordinary skill in the art will recognize, however, that these sizes may be scaled up or down as appropriate depending on the particular application regardless of pad diameter.

FIG. 3A shows a cross-sectional view of a chemical mechanical polishing pad 300 according to a preferred embodiment of the present invention. Polishing pad 300 includes a plurality of substantially evenly distributed slurry injection holes 302. As with conventional pads, the pad 300 adheres to a flexible pad backing 304 which includes a plurality of pad backing holes 306 aligned with the slurry injection holes 302. Pad 300 also includes a plurality of substantially evenly distributed slurry drain holes 308. The slurry drain holes 308, are not aligned with holes in the pad backing 304, but are instead aligned with slurry drain grooves running along the interface 310 of the pad 300 and the pad backing 304. The slurry drain grooves may be in the upper surface of the pad backing 304 and/or in the bottom surface of the pad 300. Pad bottom slurry drain grooves 320, and pad backing slurry drain grooves 325 are represented by phantom lines at the base of drain holes 308 in FIG. 3A. In either case, slurry from the polishing surface 312 of the pad 300 is able to drain down through a slurry drain hole 308 into a slurry drain groove at the pad/pad backing interface 310, and drain off the edge of the pad/pad backing through the slurry drain groove.

In a preferred embodiment, the pad 300 is bonded to the pad backing 304 by a suitable adhesive so that the aligned slurry injection holes 302 and the pad backing holes 306 provide a path for the slurry to reach the pad's polishing surface 312 without leaking into the pad/pad backing interface 310. The pad's drain holes 308 provide a path for the slurry off the polishing surface 312 and into the interface 310, where it is guided to the edge and off the pad/pad backing by the drain grooves.

Some conventional pad backings already include grooves in their surfaces for the purpose of increasing flexibility. Where such a pad backing is adhered to a pad in accordance with the present invention, it may not be necessary to cut any additional drain grooves. The existing grooves may act as drain grooves as long as they are properly aligned with the drain holes in the pad. Where a pad backing which does not already include grooves is used, drain grooves should be cut in the pad backing and/or the bottom of the pad before the two are bonded together.

FIG. 3B shows a top view of a CMP pad 350 according to a preferred embodiment of the present invention. In order to more easily distinguish between the two types of holes in the pad 350, the slurry injection holes 352 are represented by X's and the slurry drain holes 354 are represented by O's in this illustration. In this embodiment, the slurry drain holes 352 are located on concentric circular slurry distribution grooves 356 on the polishing surface 358 of the pad 350. The slurry drain holes 354 are located on concentric circular slurry drain grooves 360 on the polishing surface 358 of the pad 350. The drain holes 354 are also aligned with radial slurry drain grooves 362 on the bottom 364 of the pad 350.

Slurry is provided to the surface 358 of the pad through the slurry injection holes 352. The slurry spreads across the pad's surface 358 towards the pad's center 366 and the edge 368 of the pad as determined by the centripetal and linear forces generated by the pad's orbital and/or rotational motion. The slurry's flow across the polishing surface is further controlled by the slurry distribution grooves 356 which direct the slurry along their circular paths. The slurry distribution grooves 356 help prevent accumulations of fresh slurry in regions of the polishing surface, particularly those immediately adjacent to injection holes 352, which could result in local increased material removal and uneven polishing.

A small amount of used slurry near the edge 368 of the pad may drain off the edge. The remaining majority of the used slurry collects in the surface drain grooves 360 and is removed from the polishing surface 358 via the drain holes 354. From the drain holes 354, the slurry proceeds into the pad bottom drain grooves 362 where it flows towards the edge 368 of the pad and off.

Of course, the slurry distribution and drain grooves, and the slurry injection and drain holes, may be of any size and number and arranged in any desired pattern which achieve the objectives of improving control of slurry flow on a CMP pad surface and/or providing through-the-pad slurry drainage. Moreover, the polishing pad surface may also have microgrooves.

In one preferred embodiment, the distribution and drain grooves may be about 0.2 to 2 millimeters deep and 0.2 to 2 millimeters wide, more preferably about 0.5 to 1 millimeter deep and 0.5 to 1 millimeter wide, and most preferably about 0.8 millimeter deep and 0.8 millimeter wide, and the injection and drain holes may be about 0.2 to 2 millimeters, more preferably about 0.5 to 1 millimeter, and most preferably about 0.8 millimeter in diameter.

It should also be noted that since the drain grooves in the pad bottom (or the top of the pad backing) provide discrete points at which slurry exits a polishing pad during CMP, the present invention facilitates collection of used slurry. By equipping the CMP apparatus to collect used slurry from the drain groove outlets at the pad edge, used slurry is prevented for going into the CMP waste stream, and may be recycled for use in future polishing operations.

FIG. 3C shows a slurry injection chemical mechanical polishing (CMP) apparatus, such as that illustrated in FIG. 1A, equipped with a CMP pad according to the embodiment of the present invention depicted in FIG. 3A. As the with conventional pad 102 depicted in FIG. 1A, the pad 300 adheres to a flexible pad backing 304, which together are positioned above the slurry mesh 106 in the CMP apparatus 100. In this configuration, a slurry flow path is defined by the slurry entering through slurry inlet 114, spreading out through the slurry mesh 106 below the pad backing 304, entering pad backing holes 306 and exiting through slurry injection holes 302 on the surface 312 of the polishing pad 300. Slurry is distributed on the pad surface by centripetal and linear forces generated by the pad's orbital and/or rotational motion. The slurry exit path is defined by the used slurry entering the slurry drain holes 308, proceeding to slurry drain grooves (not shown) at pad/pad backing interface 310, and exiting off the edge the pad through the drain grooves.

FIG. 4A shows a cross-sectional view of an alternative embodiment of a CMP pad according to the present invention adapted for use with the CMP apparatus illustrated in FIG. 2A. Polishing pad 400 includes slurry drain holes 402 which drain used slurry from the polishing surface 404 to slurry drain grooves (not shown) at the interface 406 of the pad 400 and the platen 408. In a preferred embodiment, the bottom of the pad 400 includes slurry drain grooves which are aligned with the slurry drain holes 402 in the pad. In an alternative embodiment, the slurry drain holes 402 may be aligned with slurry drain grooves provided in the surface of a platen used with CMP pads according to the present invention.

The slurry drain holes and grooves may be of any size and number and arranged in any desired pattern which achieve the objectives of improving control of slurry flow on a CMP pad surface and/or providing through-the-pad slurry drainage. Moreover, the polishing pad surface may also have microgrooves.

In one preferred embodiment, the distribution and drain grooves may be about 0.2 to 2 millimeters deep and 0.2 to 2 millimeters wide, more preferably about 0.5 to 1 millimeter deep and 0.5 to 1 millimeter wide, and most preferably about 0.8 millimeter deep and 0.8 millimeter wide, and the injection and drain holes may be about 0.2 to 2 millimeters, more preferably about 0.5 to 1 millimeter, and most preferably about 0.8 millimeter in diameter. As previously noted, the CMP apparatus may be equipped to collect used slurry from the drain groove outlets at the pad edge for use in future polishing operations.

FIG. 4B shows a top view of the CMP pad according to the present invention shown with the CMP apparatus in FIG. 4A. Pad 400 includes slurry drain holes 402 and grooves 403, and microgrooves 412 in the pad surface 404. Alternative embodiments may not have microgrooves.

FIG. 4C shows a bottom view of the CMP pad shown in FIG. 4B. The pad 400 includes slurry drain holes 402 which intersect slurry drain grooves 430 in its bottom surface 432. As noted previously, the slurry drain grooves in the pad bottom may be in any pattern which facilitates slurry removal from the pad. For example, the slurry drain grooves may be in a radial pattern.

FIG. 5 shows a flow chart depicting the steps of a method of conducting chemical mechanical polishing in accordance with a preferred embodiment of the present invention. The method 500 starts at 502 and at step 540 a slurry is provided to a CMP pad surface. As described above, the slurry may be provided, for example, via a through pad injection system or directly to the pad surface from a source mounted above the pad. At a step 506, the pad is used to conduct CMP on a semiconductor wafer. Then, at a step 508, used slurry is drained from the polishing pad surface through the polishing pad. As illustrated and described above, this through the pad drainage occurs, in preferred embodiments, through slurry drainage holes and grooves in the CMP pads. The process illustrated in FIG. 5 is completed at 510. As noted above, alternative processes may include a further step of collecting the used slurry as it exits the pad.

Although the foregoing invention has been described in some detail for purposes of clarity of understanding, it will be apparent that certain changes and modifications may be practiced within the scope of the appended claims. For example, while the specification has described several hole and groove patterns which accomplish the objectives of the present invention, many others which will be understood by those of skill in the art from the present disclosure to be within the spirit of the present invention may equally be used. Therefore, the present embodiments are to be considered as illustrative and not restrictive, and the invention is not to be limited to the details given herein, but may be modified within the scope of the appended claims.

What is claimed is:

1. A chemical mechanical polishing pad, comprising:
   a polishing surface;
   a bottom surface;
   a plurality of slurry drain holes through the pad from the polishing surface to the bottom surface, said holes capable of providing an exit path for slurry to leave the polishing surface; and
   at least one drain groove in said bottom surface, said at least one drain groove aligned with said slurry drain holes, said at least one groove capable of providing an exit path for slurry to leave the pad.

2. The chemical mechanical polishing pad of claim 1 further comprising at least one drain groove in said polishing surface.

3. The chemical mechanical polishing pad of claim 2 wherein said slurry drain holes are aligned with said at least one polishing surface drain groove.

4. The chemical mechanical polishing pad of claim 1, wherein said slurry drain holes are substantially evenly distributed across said polishing pad.

5. The chemical mechanical polishing pad of claim 1, wherein said at least one pad bottom groove comprises a plurality of grooves arranged in a radial pattern.

6. The chemical mechanical polishing pad of claim 1, wherein said at least one pad bottom groove comprises a plurality of grooves arranged in a grid pattern.

7. The chemical mechanical polishing pad of claim 2, wherein said at least one polishing surface groove comprises a plurality of grooves arranged in a spiral pattern.

8. The chemical mechanical polishing pad of claim 2, wherein said at least one polishing surface groove comprises a plurality of grooves arranged in a radial pattern.

9. The chemical mechanical polishing pad of claim 1, wherein the bottom surface of said pad is in engagement with the top surface of a pad backing.

10. The chemical mechanical polishing pad of claim 9, wherein said top surface of said pad backing has at least one slurry drain groove aligned with the slurry drain holes and at least one pad bottom slurry drain groove in said pad.

11. A chemical mechanical polishing pad, comprising:
    a polishing surface;
    a bottom surface;
    a plurality of substantially evenly distributed slurry injection holes in said pad;
    a plurality of substantially evenly distributed slurry drain holes in said pad;
    at least one spiral slurry injection groove in said polishing surface intersecting said slurry injection holes;
    at least one spiral slurry drain groove in said polishing surface intersecting said slurry drain holes; and
    at least one radial slurry drain groove in said bottom surface intersecting said slurry drain holes.

12. An apparatus for chemical mechanical polishing, comprising:
    a chemical mechanical polishing pad having a polishing surface, a bottom surface and a plurality of slurry drain holes through said pad;
    a pad backing having a top surface in engagement with the bottom surface of said pad, said top surface having at least one slurry drain groove aligned with said slurry drain holes.

13. The apparatus of claim 12 wherein said chemical mechanical polishing pad further comprises at least one drain groove in said polishing surface.

14. The apparatus of claim 13 wherein said slurry drain holes are aligned with said at least one polishing surface drain groove.

15. A platen for supporting a chemical mechanical polishing pad, comprising:
    a surface for engaging a chemical mechanical polishing pad;
    at least one drain groove in said surface for facilitating removal of slurry from the polishing pad during chemical mechanical polishing.

16. The platen of claim 15 wherein said at least one drain groove comprises a plurality of grooves arranged in a radial pattern on said platen surface.

17. The platen of claim 15 wherein said at least one drain groove comprises a plurality of grooves arranged in a grid pattern on said platen surface.

18. The platen of claim 15 wherein said at least one drain groove is aligned with slurry drain holes in a chemical mechanical polishing pad on said platen.

19. A process for planarization of a semiconductor wafer, comprising:

providing a slurry to a chemical mechanical polishing pad surface;

polishing a semiconductor wafer with said chemical mechanical polishing pad; and draining said slurry from said polishing pad surface through said chemical mechanical polishing pad to at least one slurry drain groove.

20. The process of claim 19 further comprising collecting the slurry drained from said pad.

21. The process of claim 19 wherein said slurry is provided to the chemical mechanical polishing pad surface from a source disposed above said pad.

22. The process of claim 19 wherein said slurry is provided to the chemical mechanical polishing pad surface by through-pad injection.

23. The process of claim 19 wherein said slurry is drained from said polishing pad surface through drain holes in the pad.

24. The process of claim 23 wherein said slurry is drained from said polishing pad surface through at least one groove in said polishing pad surface intersecting with said drain holes.

25. The process of claim 23 wherein said slurry is drained from said polishing pad surface through at least one drain groove in a bottom surface of said polishing pad which intersect with said drain holes.

26. The process of claim 24 wherein said slurry is drained from said polishing pad surface through at least one drain groove in a bottom surface of said pad which intersect with said drain holes.

27. The process of claim 23 wherein Said slurry is drained from said polishing pad surface through at least one drain groove in a top surface of a pad backing in engagement with the bottom surface of said pad, said at least one pad backing drain groove being aligned with said drain holes.

28. The process of claim 24 wherein said slurry is drained from said polishing pad surface through at least one drain groove in a top surface of a pad backing in engagement with the bottom surface of said pad, said at least one pad backing drain groove being aligned with said drain holes.

\* \* \* \* \*